US006680150B2

(12) United States Patent
Blatchford, Jr. et al.

(10) Patent No.: US 6,680,150 B2
(45) Date of Patent: Jan. 20, 2004

(54) SUPPRESSION OF SIDE-LOBE PRINTING BY SHAPE ENGINEERING

(75) Inventors: James W. Blatchford, Jr., Orlando, FL (US); Omkaram Nalamasu, Bridgewater, NJ (US); Stanley Pau, Hoboken, NJ (US)

(73) Assignee: Agere Systems Inc., Allentown, PA (US)

( * ) Notice: Subject to any disclaimer, the term of this patent is extended or adjusted under 35 U.S.C. 154(b) by 160 days.

(21) Appl. No.: 09/866,137

(22) Filed: May 25, 2001

(65) Prior Publication Data

US 2002/0177078 A1 Nov. 28, 2002

(51) Int. Cl.$^7$ ............................. G03F 9/00; G06F 17/00
(52) U.S. Cl. ............................. 430/5; 430/22; 430/30; 430/311; 430/322; 716/19; 716/20; 716/21
(58) Field of Search ..................... 430/5, 311, 322; 716/19, 20, 21

(56) References Cited

U.S. PATENT DOCUMENTS

| 5,849,440 | A  | * | 12/1998 | Lucas et al. | .................... | 430/5 |
| 6,194,104 | B1 | * | 2/2001  | Hsu          | .................... | 430/5 |
| 6,214,497 | B1 | * | 4/2001  | Stanton      | .................... | 430/5 |
| 6,401,236 | B1 | * | 6/2002  | Baggenstoss et al. | .......... | 716/19 |

OTHER PUBLICATIONS

Y. Sohda and co–workers, "Modified Mask Mehtods for Pattern Accuracy Enhancement in Electron Beam Lithography", Jl.Vac.Sci and Tech.,B, v14(6), 1996, p3850–3854.*
W–A.Loong and co–workers, "Cross–shaped pattern on Chrome Mask for 0.5mum Contact Hole Fabrication", Microelectronic Engg.,v23,1994,p175–178.*
J.S.Peterson et al., "Assessment of a Hypothetical Roadmap that Extends Optical Lithography Through the 70nm Technology Node", SPIE,v3546,(1998),p. 288–303.*
Saleh, "Image Synthesis: Discovery Instead of Recovery," 1987, pp. 463–498, *Image Recovery: Theory and Application*, Academic Press, Inc., Harcourt Brace Jovanovich, Publishers.
Liu, et al, "Optimal Binary Image Design for Optical Lithography," 1990, pp. 401–412, SPIE vol. 1264, Optical/Laser Microlithography III.
Lin, "The Attenuated Phase–Shifting Mask," Jan. 1992, pp. 43–47, Solid State Technology.
Liu, et al, "Binary and Phase Shifting Mask Design for Optical Lithography," May, 1992, pp. 138–152, vol. 5, No. 2, IEEE Transactions on Semiconductor Manufacturing.

(List continued on next page.)

*Primary Examiner*—John A. McPherson
*Assistant Examiner*—Kripa Sagar
(74) *Attorney, Agent, or Firm*—Mark Marcelli; Ferdinand M. Romano

(57) ABSTRACT

Sidelobe formation in photolithographic patterns is suppressed by non-rectangular, non-circular contact openings formed in attenuated phase shift photomasks. The contact openings may be diamond-shaped, star-shaped, cross-shaped, or various other shapes which include multiple vertices. The contact opening shapes may include only straight line segments or they may include rounded segments. The contact openings may be arranged in various relative configurations such as in arrays in which the contact openings are sized and spaced by sub-wavelength dimensions. A method for forming contact openings on a photosensitive film uses the attenuated phase shift photomask to form a contact pattern free of pattern defects. A computer readable medium includes instructions for causing a photomask manufacturing tool to generate the attenuated phase-shift photomask.

42 Claims, 3 Drawing Sheets

OTHER PUBLICATIONS

Schellenberg, et al., "Real and Imaginary Phase–Shifting Masks," Aug. 1993, pp. 237–265, SPIE vol. 1809.

Cobb, et al., "Large Area Phase–Shift Mask Design," Jan. 1994, pp. 348–360, SPIE vol. 2197, Proceedings of the SPIE.

Cui, et al., "Optimisation of Rim Phase Shift Masks for Contact Holes," Jul. 1994, pp. 147–150, Microelectronic Engineering 23 (1994).

Dao, et al., "New Approach of Rim Phase–Shifting Mask for High–Density Circuit Layout," Aug. 1994, pp. 3804–3808, J. Vac. Sci. Technology B—Microelectronics and Nanometer Structures.

Hur, et al., "Effect of Pattern Density for Contact Windows in an Attenuated Phase Shift Mask," Feb. 1995, pp. 278–289, SPIE vol. 2440.

Shin, et al., "Side–lobe Suppression in Half–Tone PSM with Optical Proximity Correction," 1995, pp. 291–299, SPIE vol. 2621.

Iwasaki, et al., "High Transmittance Rim–Type Attenuated Phase Shift Masks for Sub–0.2 µm Hole Patterns," Apr. 1998, pp. 601–608, SPIE vol. 3412.

Iwasaki, et al., "Attenuated Phase Shift Masks Reducing Side Lobe Effect in DRAM Peripheral Circuit Region," 1998, pp. 544–550, SPIE vol. 3236

Ma, et al., "Preventing Sidelobe Printing in Applying Attenuated Phase Shift Reticles," 1998, pp. 543–552, SPIE vol. 3334.

Erdélyi, et al., "Coherent Multiple Imaging by Means of Pupil Plane Filtering," Mar. 1999, pp. 762–771, SPIE vol. 3679.

Socha, et al., "Design of 200nm, 170nm, 140nm DUV Contact Sweeper High Transmission Attenuating Phase Shift Mask: Experimental Results Part 2," Mar. 1999, pp. 38–54, SPIE vol. 3679.

Socha, et al., "Resolution Enhancement with High Transmission Attenuating Phase Shift Masks," Sep. 1999, pp. 290–314, SPIE, vol. 3748.

Pau, et al., "Focus Drilling and Attenuated Phase Shift Mask for Subwavelength Contact Window Printing Using Positive and Negative Resists," Nov. 1999, pp. 2499–2506, J. Vac. Sci. Technology B Nov./Dec. 1999.

Smith, et al., "Customizing Optical Illumination," 1999, p. 4, vol. 8, No. 4, Microlithography World.

* cited by examiner

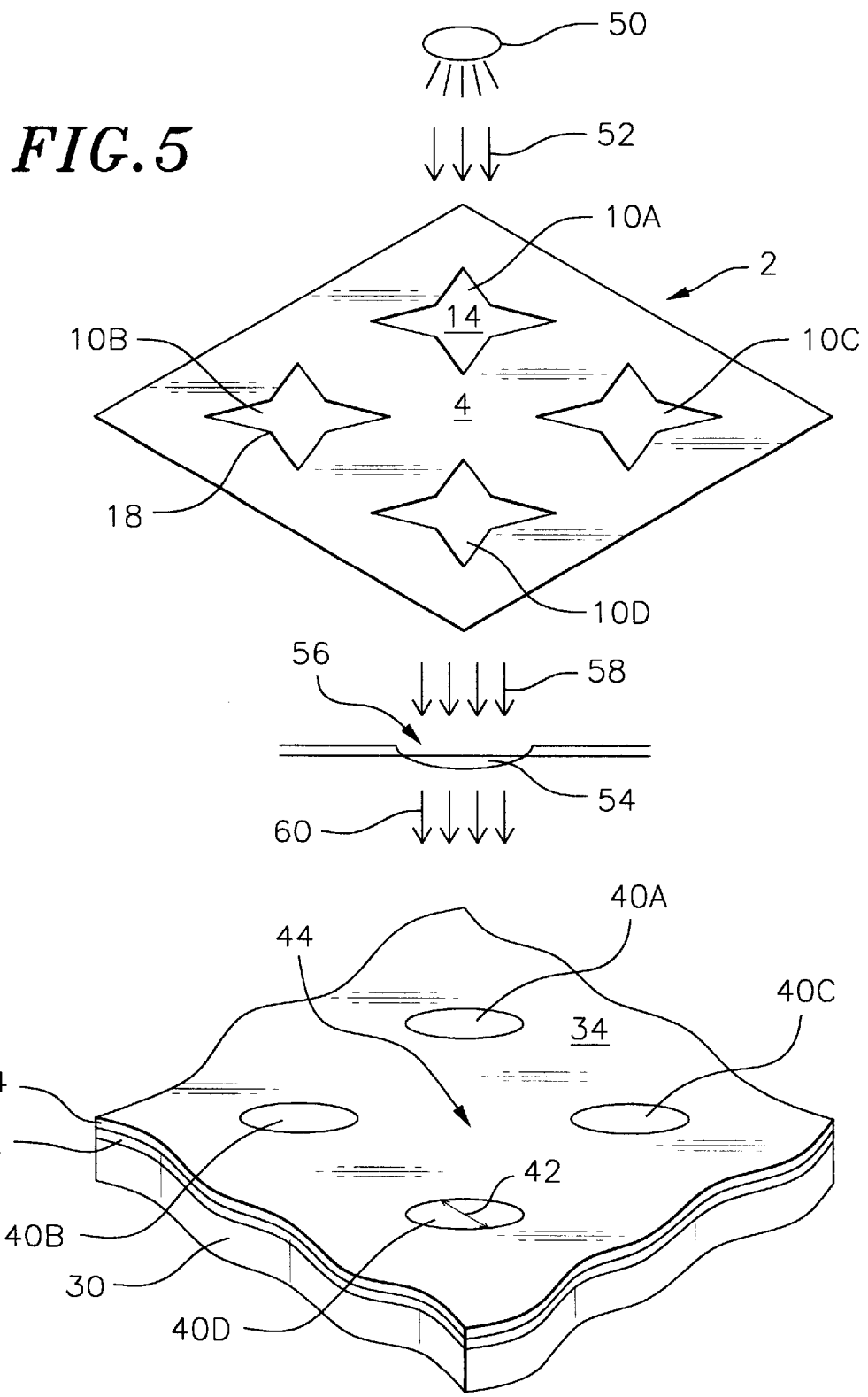

SUPPRESSION OF SIDE-LOBE PRINTING BY SHAPE ENGINEERING

FIELD OF THE INVENTION

The present invention relates, most generally, to a process and apparatus for manufacturing semiconductor devices. More particularly, the present invention is directed to forming sub-wavelength size contact openings using attenuated phase-shift photomasks.

BACKGROUND OF THE INVENTION

Attenuated phase-shift masks (APSM's) are used extensively in small geometry semiconductor manufacturing to achieve process latitude and pattern resolution greater than achievable using conventional binary photomasks. In today's rapidly advancing semiconductor manufacturing industry, which includes increasingly high levels of integration and correspondingly small feature sizes, the use of APSM's is essential in the execution of state-of-the-art fabrication processes. APSM's are fabricated by replacing the opaque part of a conventional mask with a halftone film—one that is partially transmissive. The transmissivity of such a halftone film is generally on the order of about 10% transmission. The halftone film is chosen to desirably shift the phase of the light it transmits by 180 degrees. The light which passes through the clear area of the APSM, in contrast, is not phase shifted. In this manner, destructive interference occurs between interfering light which is out of phase.

One of the main problems with APSM's, however, is the printing of sidelobes, which are unwanted images in the final pattern caused by constructive interference between adjacent clear features in the photomask pattern when the adjacent clear features are closely spaced and are separated by a distance on the order of the exposure wavelength. The occurrence of sidelobes introduces spurious ring structures and windows in dense patterns, and is highly sensitive to the presence of any aberration and defocusing in the imaging system. Sidelobe printing is especially problematic for hole dimensions less than $0.5 \times \lambda/NA$ (where $\lambda$ is the wavelength of light and NA is the numerical aperture of exposure tool), where high transmission masks must be used, and for 193 nm lithography, where current photoresists have insufficient surface inhibition to prevent sidelobe formation.

Several techniques have been used to attempt to alleviate the problem of printing unwanted features such as sidelobes. Each of these techniques includes associated shortcomings. One popular technique is underexposure. Using the underexposure technique, the pattern is printed at a lower dosage such that unwanted sidelobe features, which have a lower intensity than the main features, are not printed. A shortcoming associated with the use of this underexposure technique is that the main features are printed in smaller dimension. Additionally, the critical dimensions (CD's) are more sensitive to mask error and the depth of focus (DOF) is generally lower. Another technique is the RIM-type phase-shift mask. In RIM-type phase-shift masks, a layer of opaque material, usually chrome, is used to block out selected regions of the pattern such that the unwanted features are suppressed. A shortcoming of the RIM-type phase-shift mask is that such masks are more expensive than conventional APSM masks because of the additional complexity associated with designing, creating and aligning the chrome structures.

A third technique involves the use of auxiliary patterns as additional features on the mask, that, when properly designed and placed, suppress the intensity of the sidelobes. The auxiliary patterns may be rectangular transmission areas between closely spaced contact windows or a grid pattern for an array of contact windows. The auxiliary patterns are suitable for periodic patterns but cannot easily be generalized to non-periodic patterns. Generally speaking, auxiliary patterns occupy extra real estate on the mask and affect all of the features which surround the auxiliary pattern. A fourth technique, used to try to alleviate the problem of printing unwanted features such as sidelobes, is the manipulation of the illumination conditions. In general, interference decreases with decreasing coherence of the light waves. Lowering the coherence of the illumination sources can reduce the intensity of sidelobes but cannot eliminate sidelobe problems completely.

According to conventional photomask patterns, contact openings are produced in semiconductor devices by providing square apertures on the photomask to define a circular contact opening in the photo-pattern created in the photoresist at the wafer level. The present invention addresses shortcomings of the techniques in the prior art which attempted to prevent sidelobe formation, and presents clear contact opening apertures on attenuated phase-shift photomasks which prevent sidelobe formation even when the shape-engineered apertures are formed in tightly packed arrays.

SUMMARY OF THE INVENTION

The present invention provides an attenuated phase-shift photomask including contact structures which are non-rectangular apertures for forming contact openings on semiconductor substrates. The apertures each have a shape including multiple vertices. The present invention also provides an attenuated phase-shift photomask having multiple non-rectangular contact structures, in which the contact structures are formed of a transmissive material and bounded by a partially transmissive area, and include vertices which extend outwardly. When the array is used to form a corresponding array pattern in a photosensitive material, sidelobe formation is suppressed.

Another aspect of the present invention is a method for forming contact openings on a semiconductor substrate. The method includes the steps of forming a photosensitive film over a substrate, providing an attenuated phase-shift photomask including non-rectangular transmissive figures, each including outwardly extending vertices, and exposing contact areas on the photosensitive film by positioning the photomask in fixed position with respect to the substrate and providing a light source opposite the surface of the photomask which faces the substrate, such that each of the exposed contact areas correspond to a transmissive figure.

Another aspect of the present invention is the pattern formed in a photosensitive material. An exemplary pattern includes an array of tightly packed contact holes of small dimension, and the array is characterized by the absence of pattern defects interposed within the array.

Another aspect of the present invention is a computer readable medium. The computer readable medium includes a set of instructions for generating an attenuated phase-shift photomask having a pattern including non-rectangular contact structures, each contact structure being formed of a transmissive material, bounded by a partially transmissive area, and including outwardly extending vertices.

The present invention also provides a method for generating an attenuated phase-shift photomask. The method includes the steps of providing a photomask manufacturing tool and a computer electronically connected to the photomask manufacturing tool, providing a computer readable medium including instructions for generating an attenuated phase-shift photomask having non-rectangular contact structures, each including a plurality of outwardly extending vertices and formed of a transmissive material, and engaging the computer readable medium with the computer, such that the computer reads the computer readable medium and communicates with the photomask manufacturing tool and electronically instructs the photomask manufacturing tool to generate the attenuated phase-shift photomask.

It is to be understood that both the forgoing general description and the following detailed descriptions are exemplary, but not restrictive, of the invention.

BRIEF DESCRIPTION OF THE DRAWING

The invention is best understood from the following detailed description when read in conjunction with the accompanying drawing. It is emphasized that, according to common practice, the various features of the drawing are not to scale. On the contrary, the dimensions of the various features are arbitrarily expanded or reduced for clarity. Like numerals denote like features throughout the drawing and specification. Included in the drawing are the following figures:

FIG. 5 is a perspective view showing an exemplary APSM including shape-engineered contact openings forming corresponding exposed contact structures in a photosensitive film formed on a substrate.

DETAILED DESCRIPTION OF THE INVENTION

Figure 1:
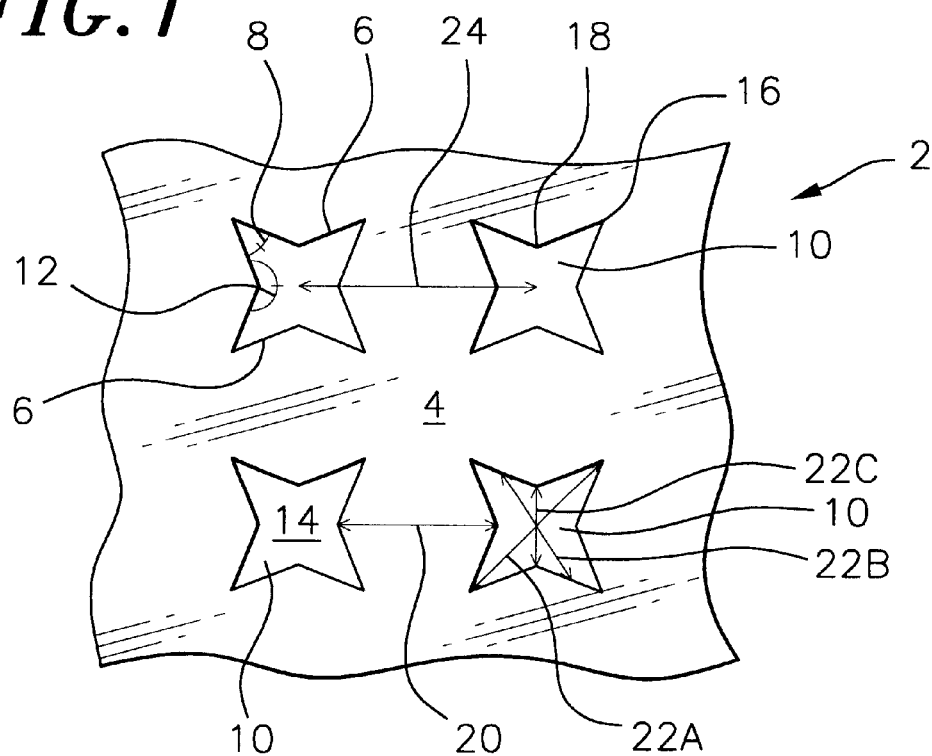
FIG. 1 is a plan view of exemplary shape-engineered contact openings formed on an APSM.

The present invention provides an attenuated phase-shift mask (APSM) manufactured using industry-known techniques and equipment such as a MEBES 4500 electron-beam exposure system. The APSM is used in a standard photolithography tool with conventional photoresist processing. According to conventional techniques, square or rectangular shaped apertures on a photomask are used to form contact holes in a photoresist pattern. The contact holes formed in a photoresist pattern, using the square-shaped apertures on the mask, are generally circular at the wafer level. In contrast, the present invention provides an APSM which includes "shape-engineered" contact openings formed of various different shapes. The contact openings in the APSM according to the present invention may be diamond-shaped, star-shaped, cross-shaped or one of various other non-rectangular, non-circular shapes which include multiple sharp corners or vertices. The shape-engineered APSM significantly reduces sidelobe formation at the wafer level.

The APSM's of the present invention may be used to form contact openings at multiple and various different processing levels in forming any of various semiconductor devices. The APSM may be a conventional photomask used in a projection lithography tool or a reticle used in a stepper. The APSM may be a "1×" mask or it may be configured to produce a corresponding pattern in a photosensitive material of reduced size. According to conventional industry standards, the APSM may be a 10× mask, a 5× mask, a 4× mask or a reticle of other degrees of magnification. In each case, the degree of magnification denotes the size of the mask relative to the size of the corresponding pattern it will be used to produce on a photosensitive film.

The contact openings formed in an APSM according to the present invention are clear areas or transmissive areas which allow for the transmission of light. The contact openings are bounded by a nearly opaque, or partially transmissive region which, together with the clear or transmissive areas, defines the mask pattern including the contact openings. A particular advantage of the present invention is that, when the shape-engineered contact openings within the APSM are formed in arrays which are tightly packed, the shape-engineered contacts prevent undesired sidelobe formation in the corresponding pattern formed in a photosensitive film. Sidelobe formation is prevented due to the shape of the shape-engineered contact openings and the phase-shift qualities of the APSM. Sidelobes are undesirable exposed features formed in the photoresist pattern due to the constructive interference of closely packed transmissive features. After the photoresist pattern is developed and etched, sidelobes result in undesirable physical features being formed in a semiconductor device.

Exemplary shapes of the various shape-engineered contact openings formed in an APSM according to the present invention, are illustrated in the accompanying figures. Preferably, the shape-engineered contacts include a clear or transmissive area bounded by a partially transmissive material. The partially transmissive material allows for typically 4–18% transmission of light. The light transmitted through the partially transmitted transmissive material is phase-shifted, preferably by 180 degrees. Therefore, when the phase-shifted light interferes with light transmitted through the clear areas, destructive interference occurs. The shape-engineered contact openings are preferably star-shaped, cross-shaped, diamond-shaped, or generally of a shape including multiple corners or vertices, in order to produce generally round contact openings in a photosensitive film. The shape-engineered contact openings may be symmetrical or non-symmetrical. Each of the contact openings may include a regular or irregular shape.

Exemplary shapes of the shape-engineered contact openings are shown in FIGS. 1–4. The shapes illustrated in FIGS. 1–4 are intended to be exemplary, not restrictive of the shape-engineered contact openings of the present invention. Now turning to FIG. 1, a portion of APSM 2 includes an array of shape-engineered contact openings 10 forming a pattern thereon. The exemplary pattern may be designed to form contact openings at any of various levels of the processing sequence used to form a semiconductor device such as the contact level and the via level. The pattern includes a 2×2 array of shape-engineered contact openings 10. It should be understood that such array is exemplary only and contact openings 10 may be arranged in any of various other two dimensional arrays. According to another exemplary embodiment, contact openings 10 may be isolated features. Contact openings 10 are clear or light-transmissive regions 14 bounded by partially transmissive material 4. Partially transmissive material 4 may be 4 to 18% transmissive according to various exemplary embodiments, and it may phase shift transmitted light by approximately 180 degrees. An exemplary transmissive material may be CrF such as manufactured by Dai Nippon Printing Company having a transmission of 5.515% and a phase-shift of 187.37 degrees for 193 nanometer wavelength light. According to other exemplary embodiments, partially transmissive material 4 may be a thin layer of chromium oxynitride or Mo—Si—ON (molybdenum silicon-oxynitride) having a thickness chosen to shift the phase of light it transmits by about 180 degrees. Other conventional materials may also be used for partially transmissive material 4. It can be seen that the pattern in the APSM is defined by the intersection of transmissive regions 14 such as which form contact openings 10, and partially transmissive material 4.

Contact openings 10 are non-rectangular and non-circular. Each of contact openings 10 includes multiple corners or vertices 16, 18. Each contact opening 10 includes multiple outwardly-extending vertices 16. The configuration of contact openings 10 shown in FIG. 1 may be considered a four pointed star. According to another description, contact openings 10 may be considered an octagon having eight sides 6. The octagon is formed by a repeating sequence of adjacent angles 8 and 12. Angle 8 is an acute angle and angle 12 is an obtuse angle. Each star-shaped contact opening 10, therefore includes multiple outwardly-extending vertices 16 which form an acute angle. According to various exemplary embodiments, angles 8 may be 20 degrees, 45 degrees, 70 degrees, or other values. In a preferred embodiment, acute angles 8 of the four pointed star are 20 degrees.

The array of contact openings include pitch 24, and spacing 20. Each contact opening 10 include an average diameter. Exemplary diameters 22A, 22B and 22C represent diameters taken at various locations within contact opening 10. Contact opening 10 is symmetrical in the exemplary embodiment shown, but non-symmetrical contact openings may be used alternatively. Generally speaking, contact openings 10 of the present invention each include a number of vertices, including a number of outwardly extending vertices such as vertices 16. Outwardly extending vertices 16 form acute angles 8. As such, the contact openings of the present invention include parallelograms, trapeziums, stars with five or more points, and various other features defined by a number of straight segments. According to other exemplary embodiments such as will be shown in FIG. 2, the contact openings of the present invention may include curved and rounded features.

Still referring to FIG. 1, the dimensions of various features such as pitch 24, spacing 20, and the average diameter may be defined in terms of the projection system used in conjunction with the APSM to produce a pattern in a photosensitive film. Pitch 24 is the center-to-center distance between adjacent openings 10. Spacing 20 is the edge-to-edge distance between adjacent openings 10. For example, feature sizes may be defined in terms of the wavelength, $\lambda$, of light used and the numerical aperture-NA of the lens used in the projection aligner or stepper. In an exemplary embodiment in which APSM is a 1× photomask, pitch 24 may vary from 0.3 to 1.0 microns, and spacing 20 may be 200 nanometers or less. The average diameter will preferably be less than 500 nanometers, but may be greater according to other exemplary embodiments. In an exemplary embodiment the average diameter may be approximately 180 nanometers or less. Various other dimensions may be used alternatively. According to another definition, pitch 24 may generally be on the order of 2× the wavelength of the light used to form the patterns. According to another exemplary definition, each of spacing 20 and the average diameter may be less than or equal to 0.75 $\lambda$/NA and the corresponding area of contact opening 10 may be less than or equal to $\pi[0.375\ \lambda/NA]^2$. According to one exemplary embodiment, the average diameter of contact opening 10 may be 0.5 $\lambda$/NA, for a 1× mask, and the average diameter of the corresponding circular contact opening formed in a photosensitive film may range from 0.3–0.4 $\lambda$/NA.

Figure 2:
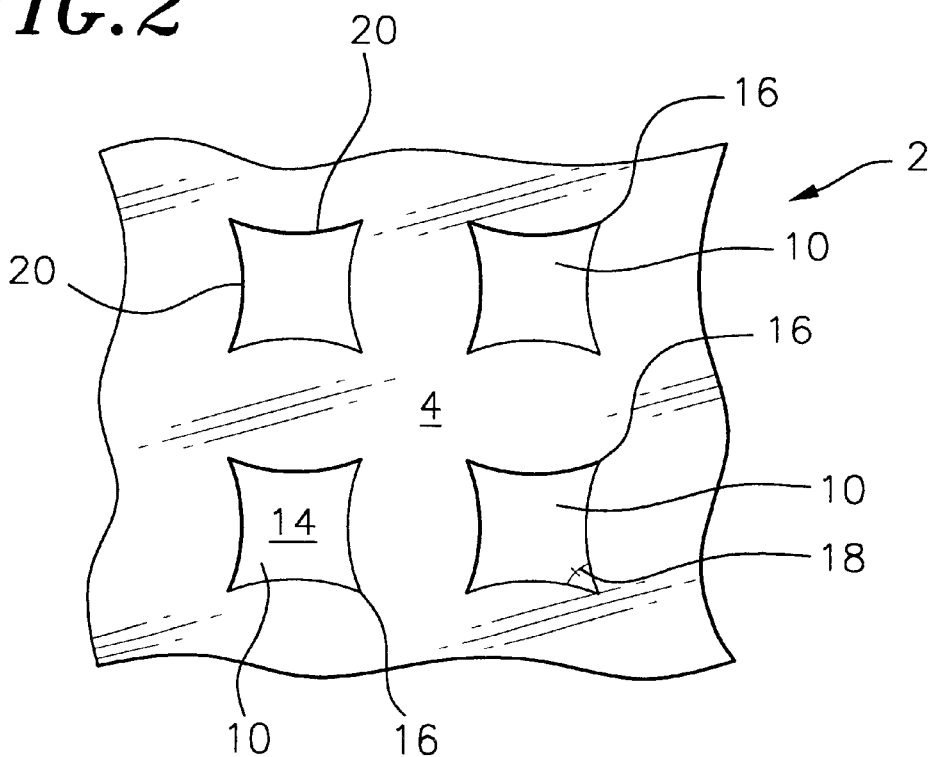
FIG. 2 is a plan view of another embodiment of exemplary shape-engineered contact openings formed on an APSM.

FIG. 2 shows another exemplary embodiment of an array of contact openings 10 of the present invention. As described in conjunction with FIG. 1, the array of contact openings represents a portion of a pattern formed in APSM 2. Contact openings 10 shown in FIG. 2 may be considered star-shaped openings with rounded sides. Each of sides 20 are inwardly bowed in a central portion. Outwardly extending vertices include angles 18 which are each less than 90 degrees. Five, six, and other multiple pointed configurations may be used alternatively and, although contact openings 10 are shown to be symmetrical, non-symmetrical contact openings may be used alternatively.

Figure 3:
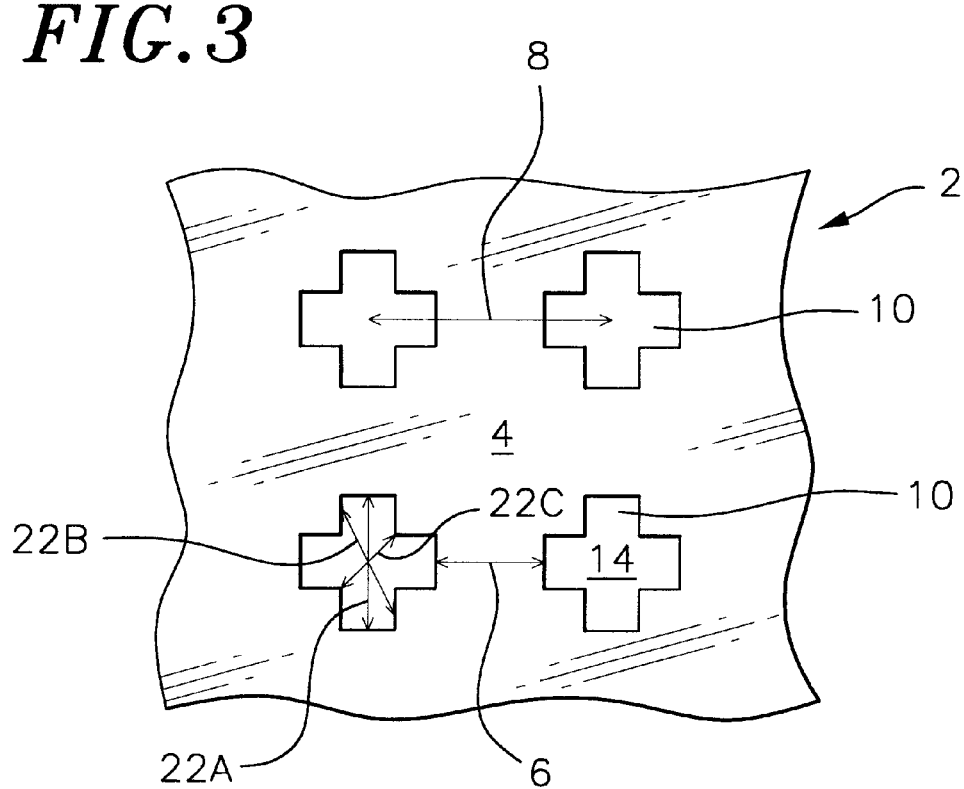
FIG. 3 is a plan view of yet another exemplary embodiment of shape-engineered contact openings formed on an APSM.
Figure 4:
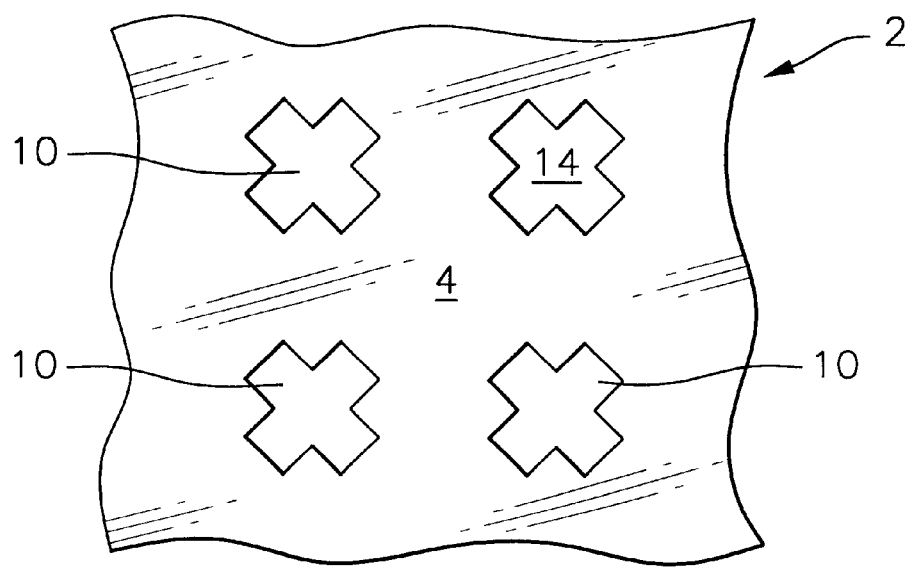
FIG. 4 is a plan view of still another exemplary embodiment of shape-engineered contact openings formed on an APSM.

The exemplary contact openings shown in each of FIGS. 3 and 4 are cross-shaped. Each of FIGS. 3 and 4 show a 2×2 array of substantially similar cross-shaped openings 10. FIGS. 3 and 4 differ, however, in the relative orientation of cross-shaped openings 10 within the array. The different relative configurations of the contact openings in the array as highlighted by FIGS. 3 and 4, may also be applied to other exemplary contact openings, such as the ones shown in FIGS. 1 and 2.

It should be emphasized at this point that the contact openings shown in the preceding figures are exemplary and not restrictive of the present invention. For example, other shapes such as diamond-shaped contact openings, and contact openings which are parallelograms, trapeziums, and other symmetrical and non-symmetrical figures are within the scope of the present invention. The shape of the contact openings may be defined by straight line segments only, or they may include curved segments. Furthermore, other non-rectangular and non-circular shapes which include rounded features, such as a diamond-shaped configuration having inwardly-bowed sides, may be used. Finally, the contact openings formed on an APSM for a particular mask level pattern, may include different shapes. According to one exemplary embodiment, an array of contact openings may be formed to include contact openings having different shapes.

FIG. 5 illustrates a perspective view of an exemplary APSM used in an optical projection system to form a corresponding pattern in a photosensitive film formed over substrate 30. APSM 2 includes an exemplary 2×2 array of contact openings 10A, 10B, 10C, and 10D. Optical source 50 emits light 52. According to an exemplary embodiment, optical source 50 may be an excimer laser. The excimer laser may be an ArF excimer laser which emits light having a wavelength of 193 nanometers, or it may be a KrF excimer laser emitting light having a wavelength of 248 nanometers. Other optical sources and light having various other wavelengths, may be used alternatively. Light 52 is a generally coherent light source having a degree of partial coherence defined by $\delta$, which may be approximately 0.3 according to a preferred embodiment. Contact openings 10A–10D are each generally in the shape of a four pointed star. In the preferred embodiment, angle 8 may be a 20 degree angle.

Still referring to FIG. 5, photosensitive material 34 is formed over substrate 30 prior to the exposure step which is used to create the photo-pattern of exposed/unexposed areas in the photosensitive material. Photosensitive film 34 may be formed over substrate 30 using any of various suitable conventional methods. Photosensitive material 34 may be a commonly used positive photoresist material but other photosensitive materials may be used alternatively. In an exemplary embodiment, photosensitive film 34 may be a TArF-7a-6 photoresist manufactured by Tokyo Ohka Kogyo Company. Other photoresist films may be used according to other exemplary embodiments. In the exemplary embodiment, photosensitive film 34 is formed over dielectric layer 32, but may be formed over any of various films in which it is desired to form contact openings.

After substrate 30 is covered with photosensitive film 34 and optical source 50, APSM 2, and substrate 30 are placed in fixed position with respect to one another, optical source 50 emits light 52. In the preferred embodiment, light 52 is substantially coherent. Transmitted light 58 passes through clear areas 14 such as contact openings 10A–10D of APSM 2. Transmitted light 58 then passes through lens 54 which includes numerical aperture 56. Numerical aperture-NA 56 is a measure of the capability of lens 54 to collect diffracted light from APSM 2 and project it onto photosensitive film 34 of substrate 30. According to some exemplary embodiments, such ones incorporating a stepper, lens 54 may be configured to uniformly reduce the size of the mask pattern. For example, for a 10× mask, a corresponding photo-pattern formed in photosensitive material 34 will be one-tenth the size of the mask pattern. Exposing light 60 which passes through the transmissive areas of the pattern and through lens 54 impinges upon photosensitive material 34 to form a photo-pattern in photosensitive material 34 which corresponds to, but may be reduced in size with respect to, the mask pattern. As such, contact opening 40A in the photo-pattern corresponds to contact opening 10A in the mask pattern, contact opening 40B in the photo-pattern corresponds to contact opening 10B in the mask pattern, and so forth. An advantageous aspect of the present invention is that sidelobe formation is suppressed even at sub-wavelength geometries. In an exemplary embodiment, exposed contact openings 40A–D may include diameter 42 being no greater than 200 nanometers and the contact openings 40A–D may be spaced apart by a distance no greater than 200 nanometers. In an exemplary embodiment, diameter 42 may be 180 nanometers. Without the shape-engineered contact openings of the present invention, central area 44, disposed centrally in the 2×2 array, would be extremely susceptible to sidelobe formation. In contrast, the present invention is characterized by the tightly packed array of contact openings of the photo-pattern formed in the photosensitive film, being free of pattern defects.

After photosensitive material 34 is exposed, it may be developed using conventional techniques. After the pattern is developed, post-develop processing may take place and the photo-pattern may be transferred into dielectric film 32 by etching or other pattern transfer means.

Reticles and photomasks such as the APSM of the present invention are produced by photomask manufacturing tools using conventional manufacturing techniques. An exemplary photomask manufacturing tool may be a MEBES 4500 electron-beam tool. Various software or other computer readable media which incorporate the geometrics of the shape-engineered, non-rectangular contact openings, may be used to generate the mask pattern which includes the shape-engineered contact openings. Software or another computer readable media includes a set of instructions stored thereon. The instructions include instructions for generating the attenuated phase-shift photomask including the pattern, contact shapes, and geometries described above. The computer readable medium may interact directly with a computer which is in electronic communication with a photomask manufacturing tool, or the computer readable medium may be used to generate a pattern generation, PG, tape which is used to communicate with the photomask manufacturing tool. The attenuated phase-shift photomask of the present invention may be manufactured by a photomask manufacturing tool which is electrically connected to a computer or computers. A pattern generation tape or software or other computer readable medium includes a set of instructions for generating the APSM including the pattern as described above, and also instructions for directing the computer to communicate with the photomask manufacturing tool to generate the APSM. The instructions included in the computer readable medium are executed by at least one computer which, in turn, electronically instructs the photomask manufacturing tool to generate the APSM. According to an exemplary embodiment, the photomask manufacturing tool includes the computer as an integral component.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be constructed as being without limitation to such specifically recited examples and conditions. For example, various other shapes may be used. Furthermore, the shape-engineered "contact openings" may be formed to various dimensions and may be used to form other features of semiconductor devices. The APSM may be used at various stages in the sequence of processing operations used to fabricate semiconductor devices. Moreover, the pattern formed in the APSM which includes the contact openings discussed herein, will further include various other features which together form the mask pattern.

All statements herein reciting principles, aspects and embodiments of the invention as well as specific examples thereof, are intended to encompass both structural and functional equivalents thereof. Additionally, it is intended that such equivalents include both currently known equivalents, such as equivalents developed in the future, i.e., any elements developed that perform the same function, regardless of structure. The scope of the present invention, therefore is not intended to be limited to the exemplary embodiments shown and described herein. Rather, the scope and spirit of the present invention is embodied by the appended claims.

What is claimed is:

1. An attenuated phase-shift photomask for suppressing side-lobe printing including contact structures being non-rectangular apertures for forming contact openings on a semiconductor substrate, said apertures each having a shape including a plurality of outwardly extending vertices which form angles less than 90 degrees, wherein said apertures suppress side-lobe printing.

2. The attenuated phase-shift photomask as in claim 1, in which said apertures are diamond-shaped.

3. The attenuated phase-shift photomask as in claim 1, in which said apertures are shaped as four pointed stars.

4. The attenuated phase-shift photomask as in claim 1, wherein said apertures are cross-shaped.

5. The attenuated phase-shift photomask as in claim 1, wherein said apertures each include an average diameter being less than 500 nanometers.

6. An attenuated phase-shift photomask for suppressing side-lobe printing having a plurality of non-rectangular contact structures, each being formed of a transmissive material, bounded by a partially transmissive area, and including a plurality of outwardly extending vertices which form angles less than 90 degrees, wherein said non-rectangular contact structures suppress side-lobe printing.

7. The attenuated phase-shift photomask as in claim 6, wherein each contact structure is symmetrical.

8. The attenuated phase-shift photomask as in claim 6, wherein said partially transmissive area allows 4–18% transmission of light.

9. The attenuated phase-shift photomask as in claim 6, in which each said contact structure comprises an enclosed geometrical shape having four sides, each side being centrally bowed inwardly such that each of the four corresponding vertices forms an angle being less than 90 degrees.

10. The attenuated phase-shift photomask as in claim 6, in which said plurality of contact structures includes four point star-shaped contact structures.

11. The attenuated phase-shift photomask as in claim 6, in which said plurality of contact structures includes diamond shaped contact structures.

12. The attenuated phase-shift photomask as in claim 6, in which said plurality of contact structures includes cross-shaped contact structures.

13. The attenuated phase-shift photomask as in claim 6, in which said photomask includes a mask pattern including said contact structures, and is a photomask of 10× magnification, said photomask adapted for producing a corresponding photo-pattern in a photosensitive film, which is reduced in size by a factor of 10 with respect to said mask pattern.

14. The attenuated phase-shift photomask as in claim 6, in which said plurality of contact structures includes contact structures which comprise an octagon defined by a repeating sequence of adjacent acute then obtuse angles.

15. The attenuated phase-shift photomask as in claim 6, wherein said contact structures each yield a corresponding generally round contact structure in a photosensitive material, when light is transmitted through said photomask and onto said photosensitive material.

16. The attenuated phase-shift photomask as in claim 6, wherein said contact structures are arranged in a two-dimensional array with adjacent contact structures spaced apart by 200 nanometers or less.

17. The attenuated phase-shift photomask as in claim 6, wherein said contact structures include an average diameter of less than 180 nanometers.

18. A method for forming contact openings on a semiconductor substrate while suppressing side-lobes comprising the steps of:
forming a photosensitive film over a substrate;
providing an attenuated phase-shift photomask being generally flat and having opposed surfaces, said photomask having a pattern including a plurality of non-rectangular transmissive figures, each including a plurality of outwardly extending vertices which form angles less than 90 degrees, wherein said non-rectangular transmissive figures suppress side-lobes; and
exposing contact areas on said photosensitive film by positioning said photomask in fixed position with respect to said substrate and providing a light source opposite the surface of said photomask facing said substrate, each of said contact areas corresponding to a transmissive figure.

19. The method as in claim 18, in which said pattern is projected onto said photosensitive film to form a corresponding photo-pattern and in which said step of exposing includes positioning a lens between said photomask and said substrate, such that said corresponding photo-pattern is reduced in size with respect to said pattern.

20. The method as in claim 18, in which said plurality of non-rectangular transmissive figures includes four point star-shaped contact structures.

21. The method as in claim 18, in which said plurality of non-rectangular transmissive figures includes diamond-shaped contact structures.

22. The method as in claim 18, in which said plurality of non-rectangular transmissive figures includes cross-shaped contact structures.

23. The method as in claim 18, in which said plurality of non-rectangular transmissive figures includes a two-dimensional array.

24. The method as in claim 23, wherein an average pitch of said non-rectangular transmissive figures in said two-dimensional array is not greater than two times the wavelength of light emitted from said light source.

25. The method as in claim 23, wherein said light source emits light having a wavelength $\lambda$ and which is delivered from said photomask to said photosensitive film, through a lens having a numerical aperture NA, and wherein said non-rectangular transmissive figures of said array are spaced apart by a dimension defined as being no greater than 0.75 $\lambda$/NA.

26. The method as in claim 18, in which said step of exposing includes said light source emitting light having a wavelength $\lambda$ and which is delivered from said photomask to said photosensitive film through a lens having a numerical aperture NA and in which said contact areas are generally round in shape and have an average diameter ranging from 0.3 $\lambda$/NA to 0.4 $\lambda$/NA.

27. The method as in claim 18, in which said step of exposing includes said light source emitting light having a wavelength $\lambda$ and which is delivered from said photomask to said photosensitive film through a lens having a numerical aperture NA and wherein the average area of said non-rectangular transmissive figures is less than $\pi[0.375\ \lambda/NA]^2$.

28. The method as in claim 18, in which said attenuated phase-shift photomask includes said non-rectangular transmissive figures being bounded by partially transmissive areas which allow transmission of 4–18% of light therethrough.

29. The method as in claim 18, in which said contact areas are generally round in shape and further comprising the step of developing said exposed generally round contact areas.

30. The method as in claim 29, which said photosensitive film is formed on an insulating layer formed over said substrate and further comprising etching said generally round contact areas into said insulating layer thereby forming said contact openings.

31. The method as in claim 18, which said light source emits light having a wavelength being one of 193 nanometers and 248 nanometers.

32. The method as in claim 18, wherein said light source comprises an excimer laser.

33. A computer readable medium having stored thereon a set of instructions including instructions for generating an attenuated phase-shift photomask for suppressing side-lobe printing having a pattern including plurality of non-rectangular contact structures, each contact structure being formed of a transmissive material, bounded by a partially transmissive area, and including a plurality of outwardly extending vertices which form acute angles, wherein said non-rectangular contact structures suppress side-lobes.

34. A computer readable medium having stored thereon a set of instructions including instructions for generating a pattern generation tape for forming a pattern in an attenuated phase-shift photomask for suppressing side-lobe printing, said pattern including a plurality of nonrectangular contact structures, each including a plurality of outwardly extending vertices which form acute angles, wherein said non-rectangular contact structures suppress side-lobes.

35. A set of instructions as in claim 34, in which said pattern includes said contact structures arranged in a two-dimensional array, with adjacent contact structure spaced apart by 200 nanometers or less and said contact structures including an average diameter no greater than 180 nanometers.

36. A computer readable medium having stored thereon a set of instructions including instructions for generating an attenuated phase-shift photomask for suppressing side-lobe printing having a pattern including plurality of non-rectangular contact structures, each contact structure being formed of a transmissive material, bounded by a partially transmissive area, and including a plurality of outwardly vertices which form acute angles, wherein said non-rectangular contact structures suppress side-lobes, when said set of instructions are executed by at least one computer electronically connected to a photomask manufacturing system.

37. A method for generating an attenuated phase-shift mask for suppressing side-lobe printing, comprising the steps of:

providing a photomask manufacturing tool;

providing a computer electronically connected to said photomask manufacturing tool;

providing a computer readable medium having stored thereon a set of instructions including instructions for generating an attenuated phase-shift photomask having a plurality of non-rectangular contact structures, each including a plurality of outwardly extending vertices which form acute angles, wherein said non-rectangular contact structures suppress side-lobes and formed of a transmissive material, and;

engaging said computer readable medium with said computer, thereby causing said computer to read said computer readable medium and communicate with said photomask manufacturing tool; and said computer electronically instructing said photomask manufacturing tool to generate said attenuated phase-shift photomask.

38. A method for generating an attenuated phase-shift mask for suppressing side-lobe printing, comprising the steps of:

providing a photomask manufacturing tool;

providing a computer electronically connected to said photomask manufacturing tool;

providing a pattern generation tape having stored thereon a set of instructions including instructions for generating a pattern on an attenuated phase-shift photomask, the pattern including a plurality of non-rectangular contact structures, each including a plurality of outwardly extending vertices which form acute angles, wherein said non-rectangular contact structures suppress side-lobes and formed of a transmissive material, and engaging said pattern generation tape with said computer, thereby causing said computer to read said pattern generation tape and communicate with said photomask manufacturing tool; and said computer electronically instructing said photomask manufacturing tool to generate said attenuated phase-shift photomask including said pattern.

39. The method as in claim 38, in which said set of instructions include instruction for generating said pattern to include a two-dimensional array of said contact structures, in which said contact structures include an average diameter no greater than 180 nanometers and are spaced apart by no greater than 200 nanometers.

40. A method for forming an attenuated phase shift mask using a single-layer pattern that suppresses side-lobes at the wafer level comprising:

forming a contact opening aperture of light transmissive material in an attenuated phase shift mask wherein said contact opening is shape engineered to reduce side-lobe formation at the wafer level by including multiple outwardly-extending vertices which form acute angles; and surrounding the contact opening aperture with a partially light transmissive area, wherein the light transmitted through the partially light transmissive area is phase shifted.

41. The method of claim 40 wherein said contact opening is shape engineered in the shape of a four-pointed star.

42. The method of claim 40 wherein said contact opening is shape engineered in the shape of a diamond.

* * * * *